(12) United States Patent
Sekine

(10) Patent No.: US 10,507,551 B2
(45) Date of Patent: Dec. 17, 2019

(54) METAL PARTICLE AND ARTICLES FORMED THEREFROM

(71) Applicant: NAPRA CO., LTD., Katsushika-Ku, Tokyo (JP)

(72) Inventor: Shigenobu Sekine, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 58 days.

(21) Appl. No.: 16/000,317

(22) Filed: Jun. 5, 2018

(65) Prior Publication Data

US 2018/0290243 A1 Oct. 11, 2018

Related U.S. Application Data

(62) Division of application No. 15/334,898, filed on Oct. 26, 2016, now Pat. No. 10,016,848.

(30) Foreign Application Priority Data

Mar. 29, 2016 (JP) .................................. 2016-065287

(51) Int. Cl.
  *B22F 1/00* (2006.01)
  *B23K 35/02* (2006.01)
  (Continued)

(52) U.S. Cl.
  CPC .......... *B23K 35/025* (2013.01); *B22F 1/0048* (2013.01); *B22F 1/025* (2013.01); *B23K 35/26* (2013.01); *B23K 35/262* (2013.01); *B23K 35/302* (2013.01); *C22C 9/02* (2013.01); *C22C 13/00* (2013.01); *H01B 1/02* (2013.01); *H01B 1/026* (2013.01); *H01B 1/04* (2013.01); *H01B 1/22* (2013.01); *H01L 24/13* (2013.01); *H01L 24/16* (2013.01); *B22F 2301/30* (2013.01); *B22F 2301/40* (2013.01); *B22F 2303/15* (2013.01); *B22F 2303/30* (2013.01);
  (Continued)

(58) Field of Classification Search
  None
  See application file for complete search history.

(56) References Cited

U.S. PATENT DOCUMENTS

| 6,199,751 B1 | 3/2001 | Gaynes et al. |
| 8,882,934 B2 | 11/2014 | Nakagawa et al. |

(Continued)

FOREIGN PATENT DOCUMENTS

| CN | 101642858 A | 2/2010 |
| CN | 103753049 A | 4/2014 |

(Continued)

OTHER PUBLICATIONS

Li et al, "Effect of Ce addition on macroscopic core-shell structure of Cu—Sn—Bi immiscible alloy", Materials Letters, Elsevier, Amsterdam, NL, vol. 64, No. 7, Apr. 15, 2010, pp. 814-816.

(Continued)

*Primary Examiner* — Daniel J. Schleis
(74) *Attorney, Agent, or Firm* — Carrier Blackman & Associates, P.C.; Joseph P. Carrier; William D. Blackman

(57) ABSTRACT

A formed article includes a metal particle which has a particle size in a range from 1 μm to 20 μm and consists of an outer shell and a core part. The core part contains Sn or a Sn alloy. The outer shell contains an intermetallic compound of Sn and Cu and covers 50% or more of a total surface area of the core part.

2 Claims, 5 Drawing Sheets

(51) Int. Cl.

|  |  |
|---|---|
| *B23K 35/26* | (2006.01) |
| *B23K 35/30* | (2006.01) |
| *C22C 9/02* | (2006.01) |
| *H01B 1/22* | (2006.01) |
| *H01B 1/02* | (2006.01) |
| *H01B 1/04* | (2006.01) |
| *B22F 1/02* | (2006.01) |
| *C22C 13/00* | (2006.01) |
| *H01L 23/00* | (2006.01) |

(52) U.S. Cl.
CPC .. *B22F 2304/10* (2013.01); *H01L 2224/13082* (2013.01); *H01L 2224/13311* (2013.01); *H01L 2224/13411* (2013.01); *H01L 2224/13447* (2013.01); *H01L 2924/01327* (2013.01)

(56) References Cited

U.S. PATENT DOCUMENTS

| 2011/0220704 A1 | 9/2011 | Liu et al. |
| 2013/0250481 A1 | 9/2013 | Sekine et al. |

FOREIGN PATENT DOCUMENTS

| EP | 2 752 270 A1 | 7/2014 |
| JP | S50-1040 | 1/1975 |
| JP | H07-235565 A | 9/1995 |
| JP | 2002-261105 A | 9/2002 |
| JP | 2002-301588 A | 10/2002 |
| JP | 2003-286456 A | 10/2003 |
| JP | 2006-196421 A | 7/2006 |
| JP | 2007-268569 A | 10/2007 |
| JP | 2008-243391 A | 10/2008 |
| JP | 2008-270796 A | 11/2008 |
| JP | 4401281 B2 | 1/2010 |
| JP | 2014-042941 A | 3/2014 |
| JP | 2014-199852 A | 10/2014 |
| WO | 2011/021923 A1 | 2/2011 |
| WO | 2014/168027 A1 | 10/2014 |

OTHER PUBLICATIONS

Wierzbica-Miernik et al., "Microstructure and chemical characterization of the intermetallic phases in Cu/(Sn, Ni) diffusion couples with various Ni additions", Intermetallics; 59 (2015) 23-31 (Year: 2015).

PORTION "A" ENLARGED

METAL PARTICLE AND ARTICLES FORMED THEREFROM

CROSS-REFERENCE TO RELATED APPLICATIONS

This application is a divisional application of co-pending U.S. patent application Ser. No. 15/334,898, filed Oct. 26, 2016, which is based on the Japanese Patent Application No. 2016-065287, filed on Mar. 29, 2016. The entire content of each of the related applications is incorporated herein by reference.

FIELD OF THE INVENTION

This invention relates to a metal particle, a paste, a formed article, and a laminated article.

DESCRIPTION OF THE RELATED ART

First, the terms used in this specification will be defined as follows:

(1) the term "metal", "metal particle" or "metal component" is used for indicating not only a simple metal element, but also an alloy composed of two or more metal elements, a composite structure, or, a combination of them;

(2) "nanometer" denotes a range of dimension below 1 μm (1000 nm); and (3) "metal matrix" denotes a metal or alloy that serves as a base material for filling up the gaps around, and supporting, other ingredients.

DESCRIPTION OF THE RELATED ART

In devices such as those kept operated at high temperatures for a long duration of time, and operated under harsh environments such as exposed to large temperature changes between operational states at high temperatures and idle states at low temperatures, represented by vehicle-borne power control devices (power devices), bonding portions are required to be able to keep high bonding strength over a long duration of time. None of the conventionally known bonding materials has, however, been enough to satisfy such requirement.

For example, a SnAgCu-based bonding material (powdery solder material) disclosed in JP-A-2007-268569 cannot satisfy the above-described requirement at all.

Another problem inherent to the case where two or more semiconductor substrates are stacked and bonded, or the case where a three-dimensional structure is formed with a metal or alloy relates to reduced mechanical strength caused by Kirkendall void. The Kirkendall void is generated when atomic vacancies (lattice defects), generated as a result unbalanced mutual diffusion of metals, accumulate rather than annihilate. For an exemplary case of a Sn—Cu interface, vacancies accumulate at the interface between an intermetallic compound and Cu, since Sn diffuses only to a lesser extent than Cu does, to thereby form the Kirkendall void. The Kirkendall void grows up to larger void or crack, may degrade reliability and quality of the bonding portion or the three-dimensional structure, may further reduce the mechanical strength, and can even result in separation, breakage, chipping or the like.

For example, JP-A-2002-261105 has disclosed a technique of connecting electrodes of a semiconductor device and electrodes of a mounting board using a connecting portion that contains $Cu_6Sn_5$ and Cu balls, wherein also Cu balls are mutually bridged with $Cu_6Sn_5$. JP-A-2002-261105 has, however, given no description on the Kirkendall void, and is therefore not construed to have disclosed a means for suppressing the generation thereof. JP-A-2014-199852 has disclosed a process of coating a bonding agent, which contains Cu metal particle and Sn particle, onto the surface to be bonded of a semiconductor chip or a substrate, heating the bonding agent at a temperature higher than the melting point of Sn, so as to allow Cu and Sn in the bonding agent to undergo transitive liquid phase sintering, followed by further heating. JP-A-2014-199852 has, however, not disclosed a means for suppressing the Kirkendall void.

JP-A-2002-301588 has disclosed a solder foil formed by rolling a solder material that contains Cu particles 2 as metal particles and Sn particles 3 as solder particles. Since, in the solder foil, Cu exists in the particle form, and Sn fills up the gaps around the Cu particles, so that the Kirkendall void is anticipated to occur unless otherwise the gaps around the Cu particles could be filled up completely by Sn.

JP-A-2003-286456 has disclosed an isotropic electro-conductive bonding sheet composed of a core film placed at the center in the thickness direction, adhesive layers disposed so as to sandwich the core film, and spherical electro-conductive particles. Through-holes that extend through the core film in the thickness direction are formed at regular intervals, and the electro-conductive particles are placed one-by-one in all through-holes. The invention, however, has failed to achieve a high heat resistance since the electro-conductive adhesive sheet has been used.

SUMMARY OF THE INVENTION

It is therefore an object of this invention to provide a metal particle, an electro-conductive paste, and a formed article that are able to form a highly reliable and high-quality electric interconnect, an electro-conductive bonding portion, or a three-dimensional structure that is less likely to produce the Kirkendall void.

It is another object of this invention to provide a metal particle, an electro-conductive paste, and a formed article that are able to form a highly heat-resistant, highly reliable and high-quality electric interconnect, an electro-conductive bonding portion, or a three-dimensional structure.

The metal particle of this invention, aimed at solving the above-described problems, includes an outer shell and a core part; the core part contains a metal or an alloy; and the outer shell includes an intermetallic compound, and covers the core part.

As described above, the metal particle of this invention has the outer shell that includes an intermetallic compound. When the bonding portion is formed by using a bonding material that contains such metal particle, diffusion towards a conductor portion to be bonded proceeds through the outer shell. Accordingly, the rates of diffusion of the metals may be suppressed, as compared with the rates shown by the conventional bonding material where the diffusion proceeds between the diffusible metals that are brought into direct contact. As a consequence, unbalanced mutual diffusion of metals, which is a causal factor of the Kirkendall void as described above, may be corrected, and thereby a highly reliable and high-quality electric interconnect, an electro-conductive bonding portion, or a three-dimensional structure, that is less likely to cause breakage or the like, may be formed.

Under a condition with a suppressed rate of diffusion, a lamellar structure with a lamellar spacing of 1 μm or smaller is formed at the bond interface with the conductive portion to be bonded. The lamellar structure is composed of a layer made of an intermetallic compound, and a layer made of a metal matrix. Since the lamellar structure is nanometer-sized, so that the Kirkendall void, even if it should occur, will be restricted within a narrow range, rather than growing up into serious defects such as cracks.

Since the lamellar structure is composed of the intermetallic compound layer and the metal matrix layer, the bonding portion can combine heat resistance under high temperatures attributable to the intermetallic compound, and flexibility attributable to the metal matrix. The bonding portions can therefore keep high levels of heat resistance, bonding strength and mechanical strength over a long duration of time, even if the devices were kept operated at high temperatures for a long duration of time, or were used under harsh environments such as exposed to large temperature changes from operational states at high temperatures down to idle states at low temperatures.

The outer shell may be formed in the same process where the metal particle is manufactured, or may be formed later typically by coating. The outer shell, when formed in the same process where the metal particle is manufactured, is composed of an intermetallic compound that contains at least one metal element composing the core part, and is formed so as to be accumulated on the surface of the core part. Meanwhile for the outer shell formed later, the intermetallic compound composing the outer shell is freely selectable. The outer shell is nanometer-sized.

The core part can contain not only a metal element or an alloy, but also contain an intermetallic compound.

The metal particle of this invention is composed of a metal selected from Cu, Al, Ni, Sn, Ag, Au, Pt, Pd, Si, B, Ti, Bi, In, Sb, Ga, Zn, Cr and Co, having a particle size of approximately 1 μm to 20 μm.

The metal particle of this invention, in particular the core part, can contain a plurality of metal components. In this case, the plurality of metal components may be a combination of a low-melting-point component and a high-melting-point component, thereby the metal particle is allowed to melt at the melting point of the low-melting-point component in the initial stage of melting, meanwhile the re-melting temperature after solidification may be elevated up to a temperature such that governed by the melting point of the high-melting-point component. The metal particle can therefore form a highly reliable and high-quality bonding portion and a conductor portion, having a good heat resistance. The metal particle characterized as such is advantageous when intended for use as an electric interconnect and an electro-conductive bonding material for configuring semiconductor devices for power control (power devices) that produce a large amount heat.

The metal particle of this invention may also be used for manufacturing a three-dimensional structure. Also in this case, the Kirkendall void may be suppressed from generating.

This invention also discloses an electro-conductive paste. The electro-conductive paste contains a plurality of metal components. The electro-conductive paste may be manufactured typically by dispersing a powder, containing the above-described metal particle of this invention, into an organic vehicle. Beside typical organic vehicles, also an aqueous vehicle or a volatile organic vehicle may occasionally be used.

The electro-conductive paste of this invention, configured to contain the metal particle of this invention, inherits characteristics and advantages originated from the metal particle.

This invention also discloses a formed article. The formed article may be obtained typically by cold pressure welding by which a powder containing the above described metal particle of this invention is allowed to join by way of inter-metal joining. The formed article may have an arbitrary form such as sheet, wire or the like.

Inside the formed article of this invention, obtained by cold pressure welding by which the powder containing the metal particle of this invention is allowed to join by way of inter-metal joining, the metal particle of this invention and other particles keep their original internal structures almost unchanged, despite some changes found in their external forms.

The formed article of this invention, configured to contain the metal particle of this invention, inherits characteristics and advantages originated from the metal particle.

This invention also discloses a laminated article. The laminated article has a laminated structure having a first layer and a second layer. The first layer contains the metal particle of this invention. The second layer configures a heat conductive layer or an electro-conductive layer. The laminated article of this invention may be formed by using an arbitrary number of the formed articles of this invention.

The laminated article of this invention, configured to have the first layer that is configured to contain the metal particle of this invention, inherits characteristics and advantages originated from the metal particle. By using the laminated article, it now becomes possible to form a highly reliable and high-quality electric interconnect and electro-conductive bonding portion that are highly heat-resistant and less likely to produce the Kirkendall void.

The laminated article of this invention, configured to have the second layer that is laminated to the first layer and configures a heat conductive layer or an electro-conductive layer, can efficiently transfer heat or can transmit electric signals, from the first layer having the Kirkendall void suppressed therein, to the second layer that serves as a heat conductive layer or an electro-conductive layer.

DESCRIPTION OF THE PREFERRED EMBODIMENTS

Figure 1:
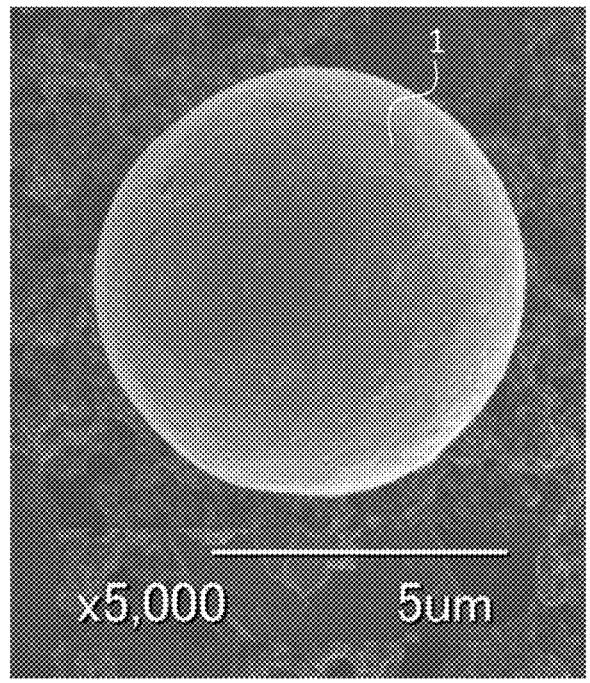
FIG. 1 is an electron micrograph showing a metal particle of this invention.

FIG. 1 shows an electron micrograph of a spherical metal particle 1 of this invention. The metal particle of this invention may be manufactured by a technique disclosed in JP-B2-4401281. The metal particle 1 is put into practical use in the form of powder, which is an aggregate of the particle.

Figure 2:
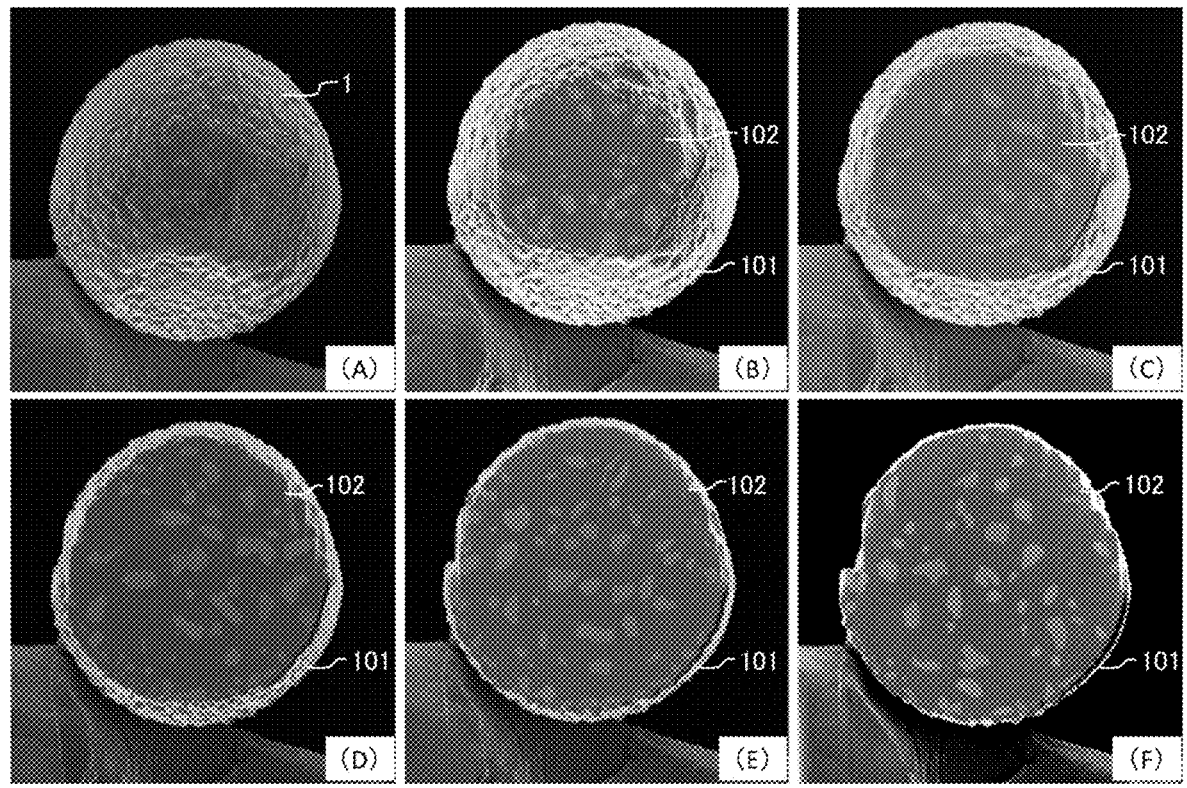
FIG. 2 is a set of electron micrographs showing cross-sections of the metal particle of this invention, taken by slicing it at regular depths from this side.

The metal particle 1 is composed of an outer shell and a core part, and the core part contains a metal, an alloy, or an intermetallic compound. The outer shell includes an intermetallic compound, and covers the core part. The detail will be explained, referring to a set of electron micrographs shown in FIG. 2. FIG. 2 is a set of electron micrographs showing cross-sections (A) to (F) of the metal particle 1 having a composition of 8% by mass of Cu and 92% by mass of Sn (referred to as 8Cu.92Sn hereinafter), wherein the cross-sections are taken by slicing it at regular depths from this side. FIG. 2(F) shows a cross-section taken so as to contain the diameter.

Referring now to FIG. 2(F), the metal particle 1 includes an outer shell 101 and a core part 102. The outer shell 101 includes an intermetallic compound of Cu and Sn, represented by $Cu_xSn_y$. The outer shell 101 is nanometer-thick. The core part 102 contains Sn, Cu, Cu—Sn alloy, or intermetallic compound of Cu and Sn represented by $Cu_xSn_y$. The intermetallic compound $Cu_xSn_y$ is typically $Cu_3Sn$ or $Cu_6Sn_5$.

Of course, the metal particle 1 is selected depending on what kind of product is desired to obtain. For example, for the purpose of forming electric interconnects, or bonding portions for interconnecting semiconductor chips, the metal particle may contain at least one metal element selected from the group consisting of Cu, Al, Ni, Sn, Ag, Au, Pt, Pd, Si, B, Ti, Bi, In, Sb, Ga, Zn, Cr and Co. Also for the purpose of obtaining a three-dimensional structure, the metal particle may contain at least one metal element selected from the group described above.

As described above, the metal particle 1 of this invention can contain a plurality of metal components. In this case, the plurality of metal components may be a combination of a low-melting-point component and a high-melting-point component, thereby the metal particle is allowed to melt at the melting point of the low-melting-point component in the initial stage of melting, meanwhile the re-melting temperature after solidification may be elevated up to a temperature such that governed by the melting point of the high-melting-point component. For example, the metal particle 1 when configured by 8Cu.92Sn as described above in the embodiment, the metal particle 1 may be allowed to melt principally at the melting point of Sn (231.9° C.) in the initial stage of melting, meanwhile the re-melting temperature after solidification may be elevated up to a temperature such that governed by the melting point of $Cu_xSn_y$ ($Cu_3Sn$: 676° C., $Cu_6Sn_5$: 435° C.) which is higher than that of Sn. In this way, a highly heat-resistant, highly reliable, and high-quality bonding portion and a conductor portion may be formed. The metal particle 1 characterized as such is advantageous when intended for use as an electric interconnect and an electro-conductive bonding material for configuring semiconductor devices for power control (power devices) that produce a large amount heat.

Figure 3:
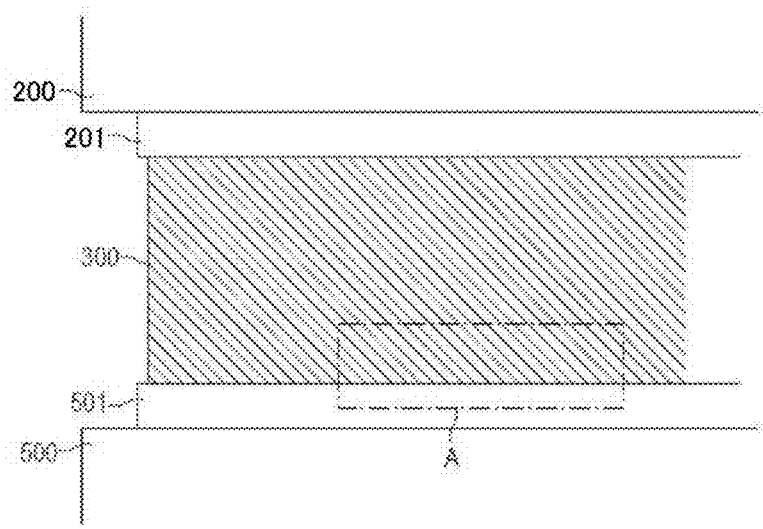
FIG. 3 is a drawing illustrating an exemplary bonding portion formed by the metal particle of this invention.

Referring now to FIG. 3, a bonding portion 300 typically joins metal/alloy bodies 201, 501 respectively formed on substrates 200, 500 opposed to each other. The substrates 200, 500 are typically substrates that configure electronic/electric devices such as power devices, on which the metal/alloy bodies 201, 501, in the forms of electrode, bump, terminal or lead conductor, are provided so as to be integrated with the substrates 200, 500. In the electronic/electric devices such as power devices, the metal/alloy bodies 201, 501 are typically composed of Cu or an alloy thereof. Of course, the invention shall not exclude the case where portions corresponded to the substrates 200, 500 are composed of the metal/alloy body.

Figure 4:
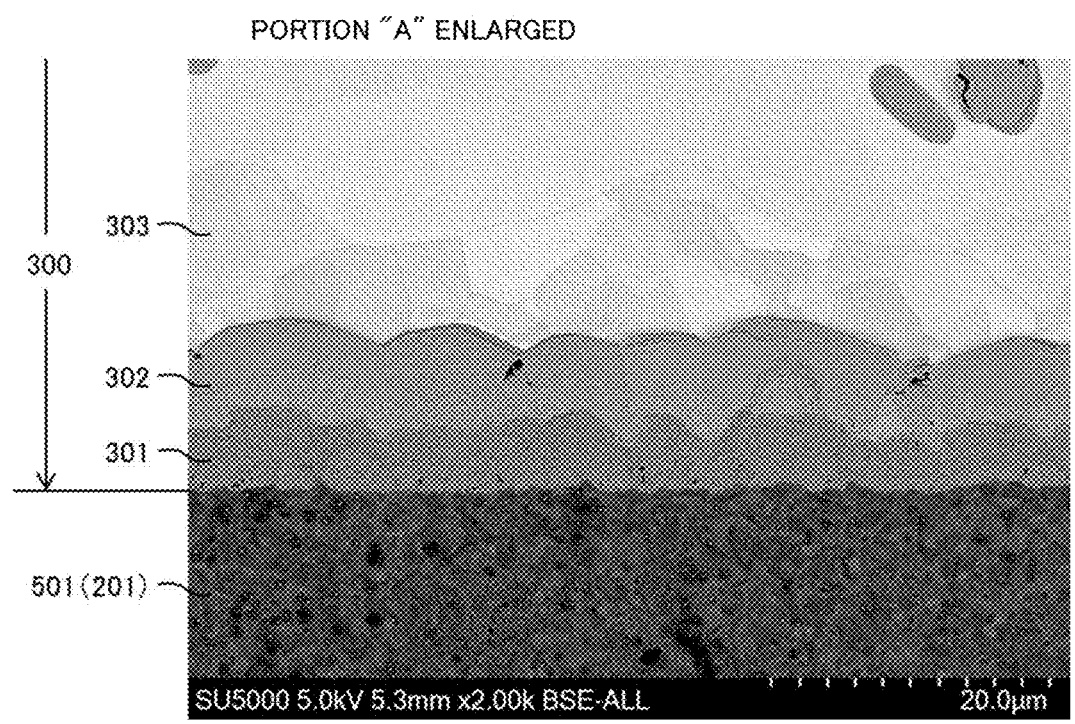
FIG. 4 is an SEM image of portion "A" in FIG. 3.
Figure 5:
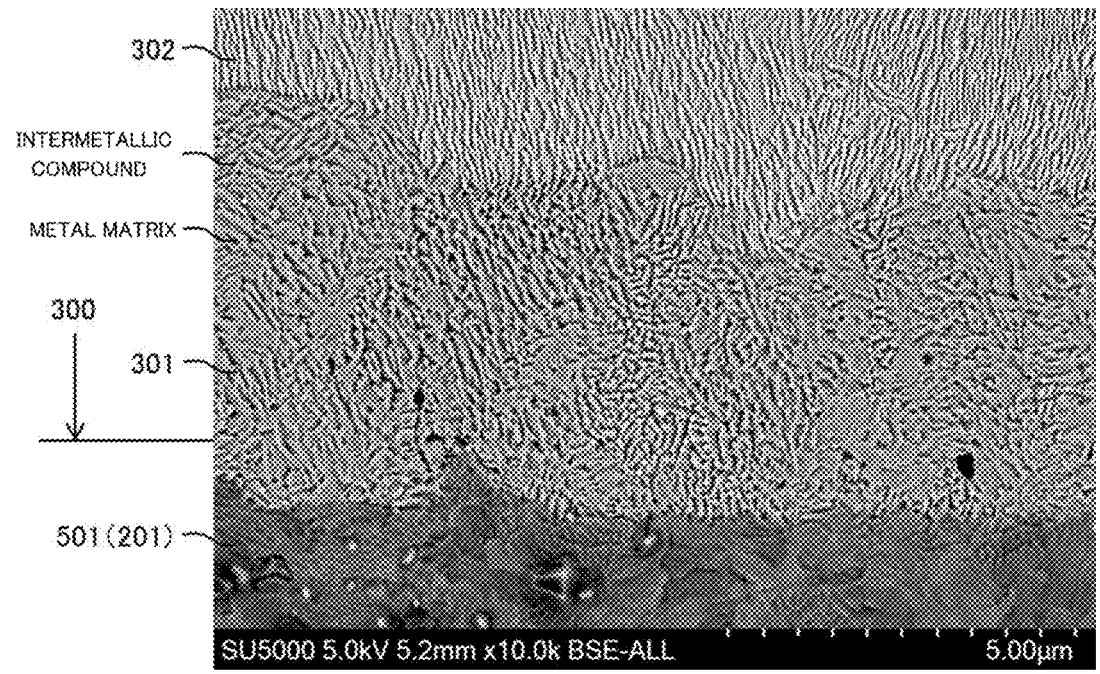
FIG. 5 is an enlarged view of the SEM image in FIG. 4.

As seen in FIG. 4 and FIG. 5, each of the metal/alloy bodies 201, 501 is a Cu layer. The bonding portion 300 may be obtained by using a bonding material that contains 8Cu.92Sn. The bonding portion 300 contains Sn, Cu, Sn—Cu alloy, or an intermetallic compound of Sn and Cu, and is bonded to the surface part of the metal/alloy bodies 201, 501 by way of diffusion.

When the bonding portion 300 is formed by using a bonding material that contains the metal particle 1, the diffusion between the metal particle 1 and the metal/alloy bodies 201, 501 proceeds through the outer shell as a matter of course. Accordingly, the rates of diffusion of the metals may be suppressed, as compared with the rates shown by the conventional bonding material where the diffusion proceeds between the diffusible metals that are brought into direct contact. As a consequence, unbalanced mutual diffusion such that Sn can diffuse only to a lesser extent than Cu can may be corrected, and thereby the Kirkendall void may be prevented from occurring. In this way, it now becomes possible to form a highly reliable and high-quality electric interconnect, an electro-conductive bonding portion, or a three-dimensional structure that is less likely to cause breakage.

As a result of such diffusion under the reduced rates of diffusion, a lamellar structure with a nanometer-scale lamellar spacing is formed at the bond interface with each of the metal/alloy bodies 201, 501. The lamellar structure will be explained referring to FIG. 4 and FIG. 5.

As seen in FIG. 4 and FIG. 5, the bonding portion 300 is configured to have a first layer 301, a second layer 302 and a third layer 303 stacked in this order on the surface of each of the metal/alloy bodies 201, 501. Each of the first layer 301 and the second layer 302 has a lamellar structure that is composed of a layer made of an intermetallic compound and a layer made of a metal matrix. Referring now to FIG. 5, mountain-like portions seen in the first layer 301 and the second layer 302 are made of an intermetallic compound, and valley-like portions are made of a metal matrix.

In this structure, the first layer 301 that adjoins the metal/alloy bodies 201, 501, namely the Cu layers, will have a lamellar structure that contains a Cu-rich intermetallic compound mainly composed of $Cu_3Sn$, and a metal matrix. The second layer distal to the metal/alloy bodies 201, 501, namely the Cu layers, will have a lamellar structure that contains an intermetallic compound mainly composed of $Cu_6Sn_5$, and a metal matrix.

In short, the bonding portion 300 can combine heat resistance under high temperatures attributable to the intermetallic compound, and flexibility attributable to the metal matrix. The bonding portions can therefore keep high levels of heat resistance, bonding strength and mechanical strength over a long duration of time, even if the devices were kept operated at high temperatures for a long duration of time, or were used under harsh environments such as exposed to large temperature changes from operational states at high temperatures down to idle states at low temperatures.

Since the lamellar structure has a lamellar spacing of nanometer scale, so that the Kirkendall void, even if it should occur, will be restricted within a narrow range. The Kirkendall void will, therefore, not grow up into cracks or other serious defects capable of degrading the reliability and quality of the bonding portion or the three-dimensional structure, further degrading the mechanical strength, and causing separation, breakage, chipping or the like.

For reference, the present inventors have obtained test results from our high temperature storage (HTS) test at 260° C., that the shear strength of the bonding portion 300 increased from approximately 35 MPa up to approximately 40 MPa over the period from the start of test up to approximately 100 hours after, and was stabilized at around 40 MPa over the period up to 500 hours after.

The present inventor have also obtained test results from our thermal cycle test (TCT) over the range from −40 to 200° C., that the shear strength stabilized approximately at 30 MPa over the entire cycles (1000 cycles), after at around the 200th cycle and thereafter.

In order to obtain the results described above, at least 50% or more of the surface area of the core part need be covered with the outer shell, in the metal particle 1 of this invention. Good results may be obtained preferably when 70% or more, and more preferably when 80% or more of the surface area is covered with the outer shell.

The electro-conductive paste of this invention contains a plurality of metal components. The electro-conductive paste is prepared typically by dispersing a powder containing the above-described metal particle 1 of this invention into a vehicle. The vehicle is typically an organic vehicle, and is used in combination with an organic solvent. Not only typical organic vehicles, but also an aqueous vehicle or a volatile organic vehicle may occasionally be used.

The electro-conductive paste of this invention, configured to contain the metal particle 1 of this invention, inherits characteristics and advantages originated from the metal particle 1.

Figure 6:
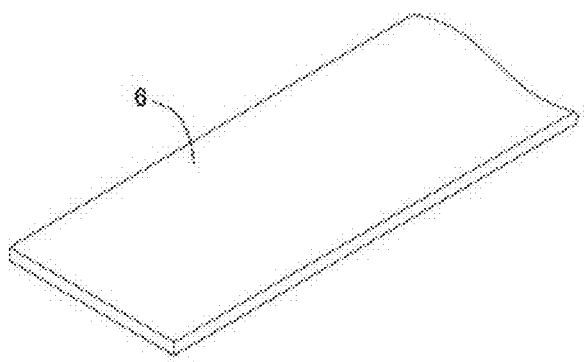
FIG. 6 is a drawing illustrating a formed article of this invention.
Figure 7:
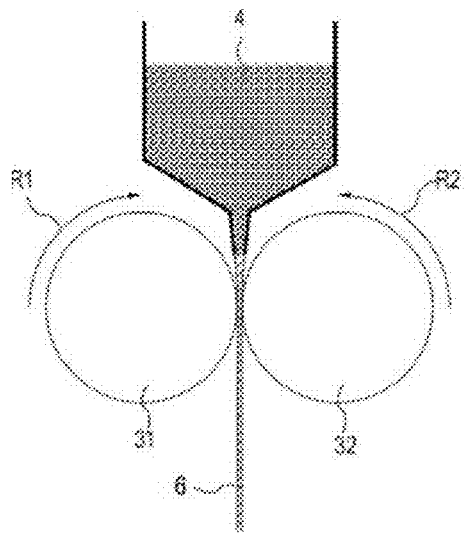
FIG. 7 is a drawing illustrating inter-metal joining by cold pressure welding.

FIG. 6 and FIG. 7 illustrate a formed article 6 of this invention. The formed article 6 illustrated in FIG. 6 has a sheet form. The formed article 6 may alternatively have the form of chip or long part, and may still alternatively be a wire with a circular cross-section or a wire with an elliptic cross-section. In short, the formed article 6 may have an arbitrarily selectable form.

The formed article 6 of this invention may be obtained typically by cold pressure welding by which a powder containing the above described metal particle 1 of this invention is allowed to join by way of inter-metal joining. A variety of methods of the inter-metal joining per se, effected by cold pressure welding, have been known, and such known methods may be applied to this invention. FIG. 7 illustrates a typical example of application. As seen in FIG. 7, a powder 4 that contains the metal particle of this invention is fed between pressure welding rollers 31, 32 that rotate in counter directions R1, R2, and pressurized by the pressure welding rollers 31, 32, to thereby allow the metal particle composing the powder 4 to cause inter-metal joining. In the practical treatment, the powder 4 is preferably heated at around 100° C. through the pressure welding rollers 31, 32. In this way, the formed article 6 illustrated in FIG. 6 and FIG. 7 may be obtained.

Inside the formed article 6 of this invention, obtained by cold pressure welding by which the powder containing the metal particle of this invention is allowed to join by way of inter-metal joining, the metal particle of this invention and other particles keep their original internal structures almost unchanged, despite some changes found in their external forms. Accordingly, the formed article 6 of this invention inherits characteristics and advantages originated from the metal particle 1 of this invention.

Figure 8:
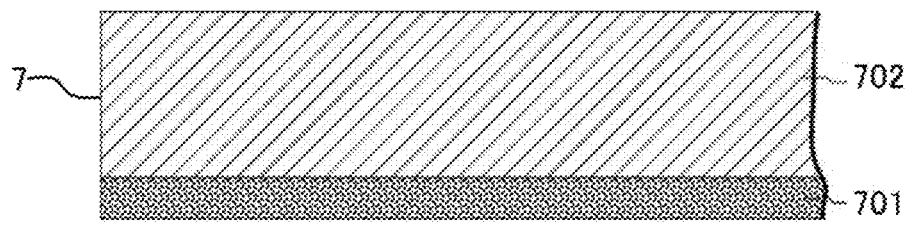
FIG. 8 is a drawing illustrating a laminated article of this invention.
Figure 9:
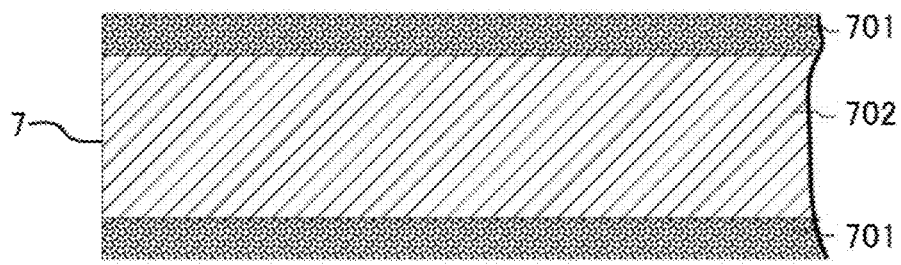
FIG. 9 is a drawing illustrating another example of the laminated article.
Figure 10:
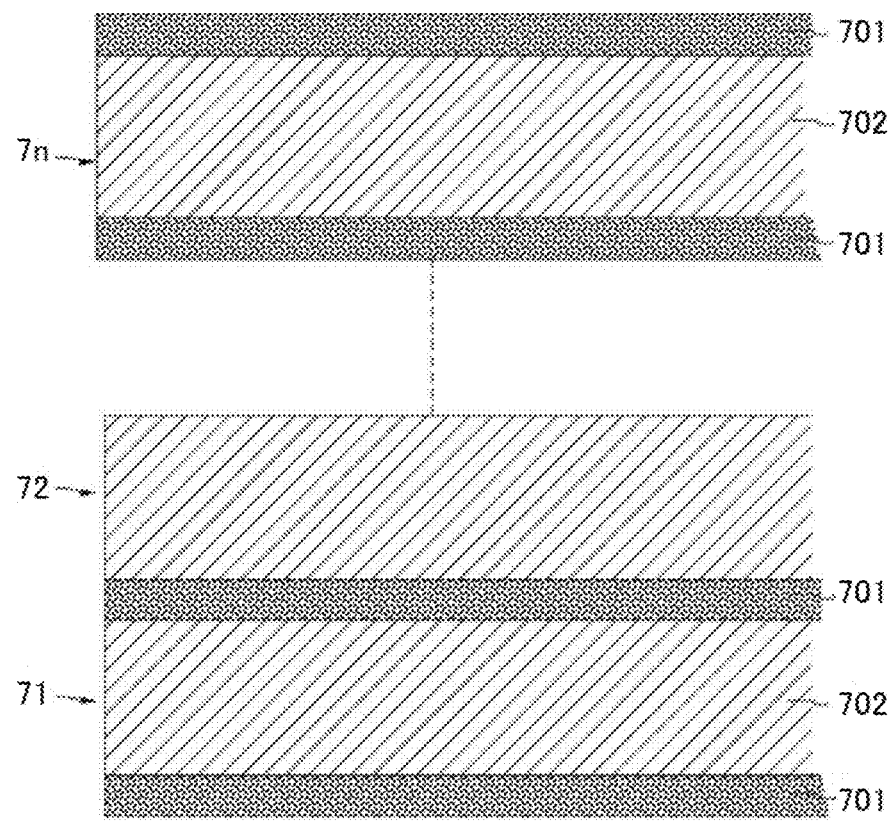
FIG. 10 is a drawing illustrating still another example of the laminated article of this invention.

FIG. 8 to FIG. 10 illustrate the laminated article of this invention. Referring now to FIG. 8, a laminated article 7 illustrated here has a laminated structure of a first layer 701 and a second layer 702. The first layer 701 is the formed article 6 of this invention, and is typically the sheet-like article illustrated in FIG. 6.

The second layer 702 configures a heat conductive layer or an electro-conductive layer. Specific examples may include a layer mainly composed of Cu, and a layer mainly composed of Cu and carbon nanotube (CNT).

The laminated article 7 of this invention may be configured as illustrated in FIG. 9, by providing the first layer 701, that is the formed article 6 of this invention, on both surfaces of the second layer 702, or, may be formed as illustrated in FIG. 10, by laminating an arbitrary number of the articles illustrated in FIG. 8 and FIG. 9.

Since the laminated article 7 of this invention has the first layer 701 and the second layer 702 laminated thereon, and since the first layer 701 contains the metal particle 1 of this invention, so that the laminated article 7 inherits characteristics and advantages originated from the metal particle 1 of this invention. As a consequence, by using the laminated article 7, it now becomes possible to form a highly reliable and high-quality electric interconnect and electro-conductive bonding portion having high mechanical strength and high heat resistance, and being less likely to produce the Kirkendall void.

The laminated article 7 of this invention, configured to have the second layer 702 that is laminated to the first layer 701 and configures a heat conductive layer or an electro-conductive layer, can efficiently transfer heat or can transmit electric signals, from the first layer 701 having the Kirkendall void suppressed therein, to the second layer 702 that serves as a heat conductive layer or an electro-conductive layer. The laminated article is advantageous when intended for use as an electro-conductive bonding material or an electric interconnect for configuring power devices that produce a large amount heat.

This invention has been detailed above referring to some preferred embodiments by which this invention by no means limited. It is apparent that those skilled in the art can contemplate a variety of modifications based on the basic technical spirit and teaching of this invention.

As has been described above, this invention can provide a metal particle, a paste, a formed article, and a laminated article that are able to form a highly reliable and high-quality electric interconnect, an electro-conductive bonding portion, or a three-dimensional structure that is less likely to produce the Kirkendall void.

This invention can also provide a metal particle, a paste, a formed article, and a laminated article that are able to form a highly heat-resistant, highly reliable and high-quality electric interconnect, an electro-conductive bonding portion, or a three-dimensional structure.

What is claimed is:

1. A formed article containing a metal particle, wherein:
   the metal particle consists of a core part and an outer shell, the core part containing a metal or an alloy, the outer shell comprising an intermetallic compound and covering the core part;
   50% or more of a total surface area of the core part is covered with the outer shell;
   a particle size of the metal particle being from 1 μm to 20 μm;
   the core part containing Sn or a Sn alloy; and
   the outer shell containing an intermetallic compound of Sn and Cu.

2. A laminated article having a laminated structure of a first layer and a second layer, the first layer containing a metal particle, and the second layer configuring a heat conductive layer or an electro-conductive layer, wherein:
- the metal particle consists of a core part and an outer shell, the core part containing a metal or an alloy, the outer shell comprising an intermetallic compound and covering the core part;
- wherein 50% or more of a total surface area of the core part is covered with the outer shell;
- a particle size of the metal particle being from 1 μm to 20 μm;
- the core part containing Sn or a Sn alloy; and
- the outer shell containing an intermetallic compound of Sn and Cu.

* * * * *